US008021802B2

(12) United States Patent
Jeong

(10) Patent No.: US 8,021,802 B2
(45) Date of Patent: Sep. 20, 2011

(54) PHASE SHIFT MASK FOR DOUBLE PATTERNING AND METHOD FOR EXPOSING WAFER USING THE SAME

(75) Inventor: Goo Min Jeong, Cheongju-si (KR)

(73) Assignee: Hynix Semiconductor Inc., Icheon-si (KR)

( * ) Notice: Subject to any disclaimer, the term of this patent is extended or adjusted under 35 U.S.C. 154(b) by 275 days.

(21) Appl. No.: 12/344,746

(22) Filed: Dec. 29, 2008

(65) Prior Publication Data

US 2009/0269679 A1  Oct. 29, 2009

(30) Foreign Application Priority Data

Apr. 25, 2008 (KR) .................. 10-2008-0038912

(51) Int. Cl.
*G03F 1/00* (2006.01)
*G03C 5/00* (2006.01)
(52) U.S. Cl. .......................... 430/5; 430/394
(58) Field of Classification Search .............. 430/5, 311, 430/394
See application file for complete search history.

(56) References Cited

U.S. PATENT DOCUMENTS

| | | | | |
|---|---|---|---|---|
| 5,302,477 A | * | 4/1994 | Dao et al. | 430/5 |
| 5,932,378 A | * | 8/1999 | Lee | 430/5 |
| 6,686,102 B2 | | 2/2004 | Randall et al. | |
| 6,861,180 B2 | | 3/2005 | Chang | |
| 7,014,962 B2 | * | 3/2006 | Lin et al. | 430/5 |
| 7,754,397 B2 | * | 7/2010 | Konishi et al. | 430/5 |
| 2001/0003026 A1 | * | 6/2001 | Lin et al. | 430/5 |
| 2002/0058188 A1 | * | 5/2002 | Iwasaki et al. | 430/5 |
| 2003/0223050 A1 | * | 12/2003 | Fritze et al. | 355/51 |
| 2006/0177745 A1 | * | 8/2006 | Huh et al. | 430/5 |

FOREIGN PATENT DOCUMENTS

| KR | 10-2006-0007931 | 1/2006 |
|---|---|---|
| KR | 10-2006-0089550 | 8/2006 |

\* cited by examiner

*Primary Examiner* — Mark F Huff
*Assistant Examiner* — Jonathan Jelsma
(74) *Attorney, Agent, or Firm* — Marshall, Gerstein & Borun LLP

(57) ABSTRACT

A phase shift mask includes a substrate; a first phase shift pattern formed in a groove shape having a first depth within the substrate so that when a first light with a first wave length is incident, the first light transmitted through a surface of the substrate and the first light transmitted through the groove are destructively interfered and when a second light with a second wave length is incident, the second light transmitted through the surface of the substrate and the second light transmitted through the groove have a phase difference of 180 degrees; and a second phase shift pattern formed in a groove shape having a second depth within the substrate so that when the first light with the first wave length is incident, the first light transmitted through the surface of the substrate and the first light transmitted through the groove have a phase difference of 180 degrees and when the second light with the second wave length is incident, the second light transmitted through the surface of the substrate and the second light transmitted through the groove are destructively interfered.

9 Claims, 5 Drawing Sheets

PHASE SHIFT MASK FOR DOUBLE PATTERNING AND METHOD FOR EXPOSING WAFER USING THE SAME

CROSS-REFERENCE TO RELATED APPLICATIONS

The present application claims priority to Korean patent application number 10-2008-0038912, filed on Apr. 25, 2008, which is incorporated by reference in its entirety.

BACKGROUND OF THE INVENTION

The present invention relates to a photolithography, and more particularly, to a phase shift mask for double patterning and a method for exposing a wafer using the same.

As semiconductor devices are highly integrated, it is more and more difficult to form a fine pattern due to a resolution limit in a photolithography process. That is to say, although a size of the pattern required in the semiconductor device becomes finer and finer, a photolithography technology cannot keep up with the trend that the size of the pattern becomes finer.

In order to overcome such resolution limit in the exposure, there has been suggested Double Patterning Technology (DPT) using two masks. The DPT is a method that divides the entire pattern which should be included in one mask into two masks and transfers the entire pattern through two-time photolithography process using respective masks. Since this exposure using the DPT performs two-time photolithography process using two masks, registration of the mask in an exposure apparatus is a very important factor. In other words, the patterns respectively disposed in the two masks can be transferred onto a wafer with accurate distance only when the two masks in which the pattern is divisionally disposed are registered at exactly the same position in the exposure apparatus. However, it is not easy to perform accurately such mask registration. Also, when the registration error is more than a certain level, a distance between the pattern transferred through a first mask and the pattern transferred through a second mask is excessively narrowed or broaden, which may result in pattern defects.

SUMMARY OF THE INVENTION

In one embodiment, a phase shift mask includes a substrate; a first phase shift pattern formed in a groove shape having a first depth within the substrate so that when a first light with a first wave length is incident, the first light transmitted through a surface of the substrate and the first light transmitted through the groove are destructively interfered and when a second light with a second wave length is incident, the second light transmitted through the surface of the substrate and the second light transmitted through the groove have a phase difference of 180 degrees; and a second phase shift pattern formed in a groove shape having a second depth within the substrate so that when the first light with the first wave length is incident, the first light transmitted through the surface of the substrate and the first light transmitted through the groove have a phase difference of 180 degrees and when the second light with the second wave length is incident, the second light transmitted through the surface of the substrate and the second light transmitted through the groove are destructively interfered.

In another embodiment, a method for exposing a wafer using a double patterning technology includes disposing a phase shift mask over a wafer within an exposure apparatus, the phase shift mask having a first phase shift pattern within a substrate formed in a groove having a first depth in which a destructive interference is generated with respect to a first light with a first wave length and a second phase shift pattern within the substrate formed in a groove having a second depth in which a destructive interference is generated with respect to a second light with a second wave length which differs from the first wave length; transferring the second phase shift pattern onto the wafer by exposing the first light with the first wave length to be incident to the phase shift mask; and transferring the first phase shift pattern onto the wafer by exposing the second light with the second wave length to be incident to the phase shift mask.

DESCRIPTION OF SPECIFIC EMBODIMENTS

Figure 1A:
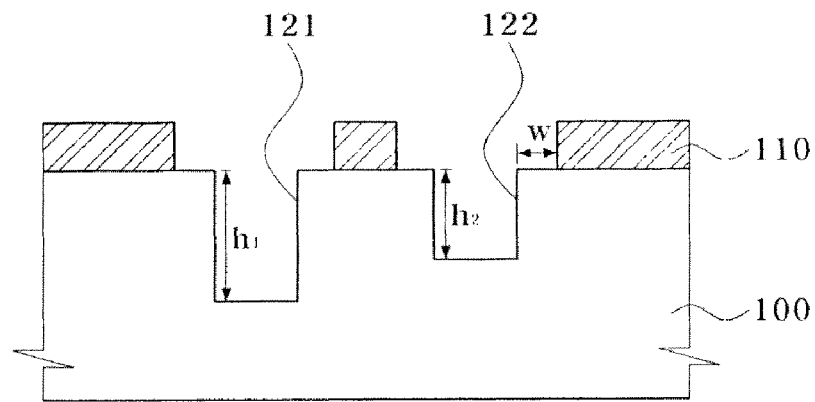
FIGS. 1A and 1B illustrate a phase shift mask for double patterning according to an embodiment of the present invention.
Figure 1B:
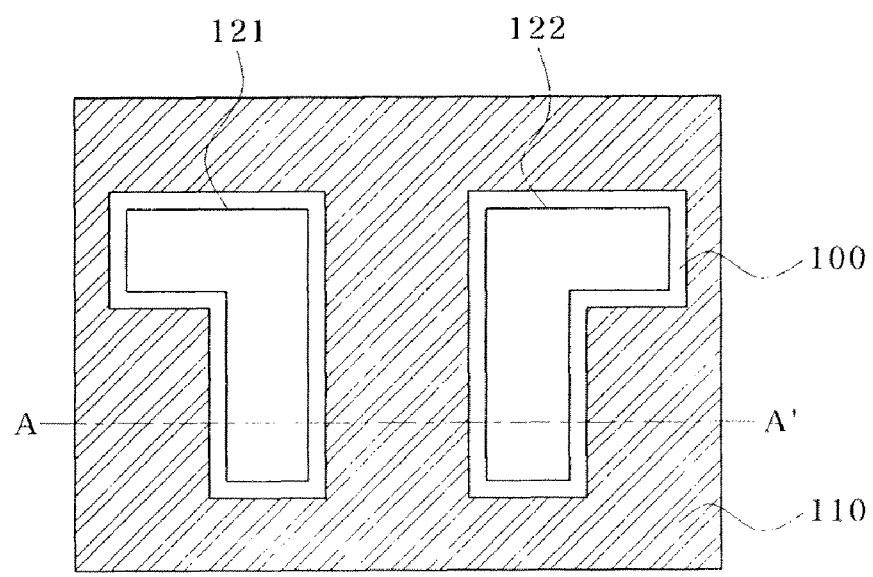

FIGS. 1A and 1B illustrate respectively a cross-sectional view and a plan view of a phase shift mask for double patterning according to an embodiment of the present invention, and a cross-sectional structure taken along line A-A' in FIG. 1B is shown in FIG. 1A. Referring to FIGS. 1A and 1B, the phase shift mask includes a substrate 100 and a first phase shift pattern 121 and a second phase shift pattern 122 disposed within the substrate 100. The first phase shift pattern 121 and the second phase shift pattern 122 are preferably disposed so as to be adjacent to each other. The substrate 100 is a transparent substrate such as quartz. The first phase shift pattern 121 is formed in a groove shape having a first depth h1 from a surface of the substrate 100, and the second phase shift pattern 122 is formed in a groove shape having a second depth h2 from the surface of the substrate 100. As such, as the first phase shift pattern 121 and the second phase shift pattern 122 are formed in the groove shape, there occurs a phase difference of a predetermined angle, e.g. 180 degree between a light transmitted through the surface of the substrate 100 and a light transmitted through the first phase shift pattern 121 and the second phase shift pattern 122. A mask pattern 110 is disposed over the surface of the substrate 100 and this mask pattern 110 exposes, by a predetermined area, the surface of the substrate 100 in the vicinity of the first phase shift pattern 121 and the second phase shift pattern 122. The area of the exposed surface of the substrate 100 is determined by the mask pattern 110, and proper control of this area can increase contrast in the exposure process using the phase shift mask. A mask pattern 110 is formed of a chrome layer or a molybdenum silicon layer.

The first depth h1 of the first phase shift pattern 121 is set so that when a first light with a first wave length is incident, the first light transmitted through the surface of the substrate 100 and the first light transmitted through the first phase shift pattern 121 are destructively interfered. Specifically, the first depth h1 of the first phase shift pattern 121 is determined by an equation $h1 = A \times (\lambda 1/2(n-1))$, wherein in this equation, A is an odd number for inducing the destructive interference, $\lambda 1$ is the first wave length and n is a refractive index of the substrate 100. The second depth h2 of the second phase shift pattern 122 is set so that when a second light with a second wave length is incident, the second light transmitted through the surface of the substrate 100 and the second light transmitted through the second phase shift pattern 122 are destructively interfered. Specifically, the second depth h2 of the second phase shift pattern 122 is determined by an equation h2=A× (λ2/2(n−1)), wherein in this equation, A is an odd number for inducing the destructive interference, λ2 is the second wave length and n is a refractive index of the substrate 100. Preferably, the first depth h1 of the first phase shift pattern 121 is set so that when the second light with the second wave length is incident, the second light transmitted through the surface of the substrate 100 and the first light transmitted through the first phase shift pattern 121 are constructively interfered. The second depth h2 of the second phase shift pattern 122 is set so that when the first light with the first wave length is incident, the first light transmitted through the surface of the substrate 100 and the second light transmitted through the second phase shift pattern 122 are constructively interfered. In this case, when the first light with the first wave length is incident to the phase shift mask, the first light passing through the first phase shift pattern 121 is destructively interfered with the first light transmitted through the surface of the substrate 100, but the first light passing through the second phase shift pattern 122 is constructively interfered with the first light transmitted through the surface of the substrate 100. Therefore, the second phase shift pattern 122 alone is transferred onto the wafer. When the second light with the second wave length is incident to the phase shift mask, the second light passing through the first phase shift pattern 121 is constructively interfered with the second light transmitted through the surface of the substrate 100, but the second light passing through the second phase shift pattern 122 is destructively interfered with the second light transmitted through the surface of the substrate 100. Therefore, the first phase shift pattern 121 alone is transferred onto the wafer.

The phase shift mask of such structure can perform the exposure with application of the double patterning without mask replacement, which will be described in more detail with reference to FIGS. 2A to 3B.

Figure 2A:
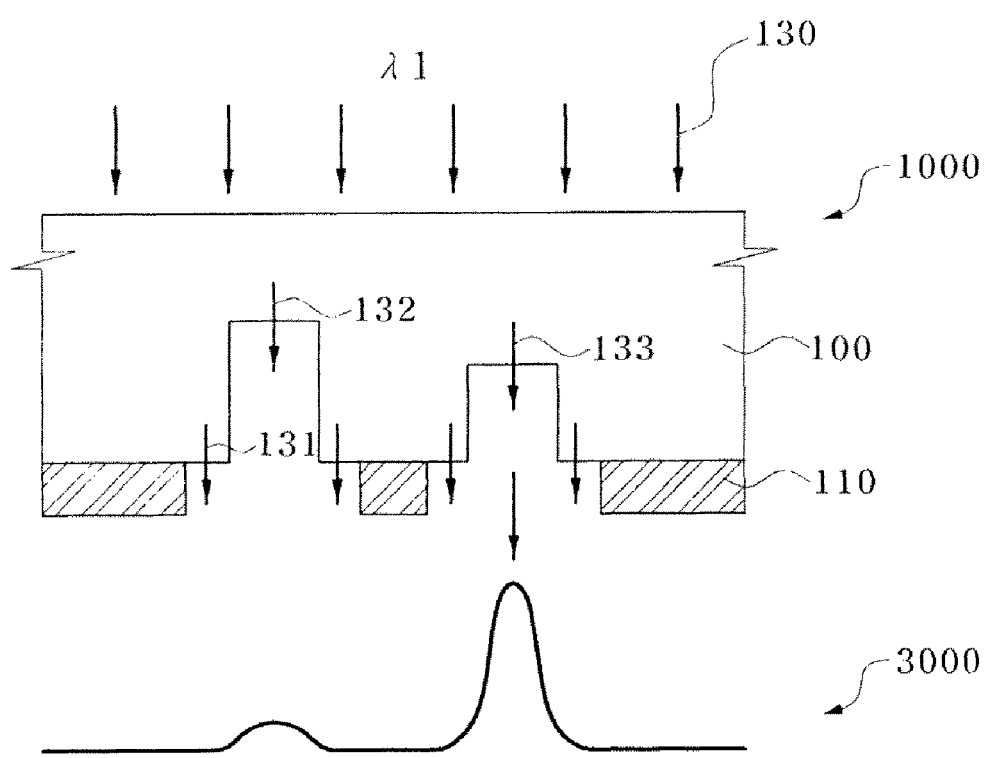
FIGS. 2A to 3B illustrate a process of exposing a wafer using the phase shift mask in FIGS. 1A and 1B.
Figure 2A:
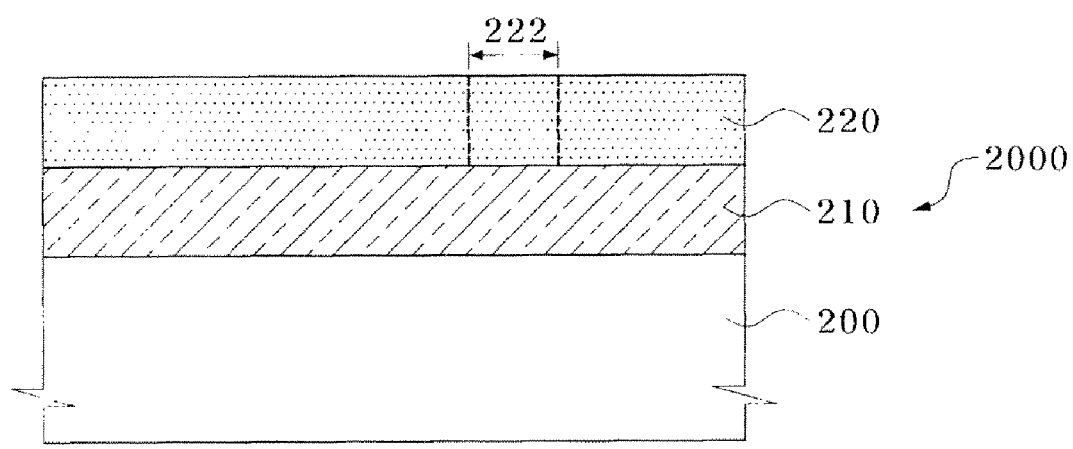

Referring first to FIG. 2A, a phase shift mask 1000 is disposed over a wafer 2000 within an exposure apparatus. The phase shift mask 1000 may have the same structure as described with reference to FIGS. 1A and 1B, and therefore duplicate description will not be made. The wafer 2000 has a structure in which a pattern target layer 210 is disposed over a substrate 200 and a photoresist layer 220 to be exposed is coated over the pattern target layer 210, but not particularly limited thereto.

A first exposure uses a first light with a first wave length λ1. To this end, the first light 130 with the first wave length λ1 is incident to the phase shift mask 1000. The first light 130 with the first wave length λ1 may be divided into a first light 131 passing through where a surface of a substrate 100, a first light 132 passing through the first phase shift pattern 121 and a first light 133 passing through the second phase shift pattern 122. When the first light 130 passes through the mask 1000, as indicated by a reference symbol "3000" in the figure, an intensity of the first light 132 transmitted through the first phase shift pattern 121 becomes close to 0, but the intensity of the first light 133 transmitted through the second phase shift pattern 122 is amplified. Therefore, the second phase shift pattern 122 alone is transferred onto the photoresist layer 220.

Figure 2B:
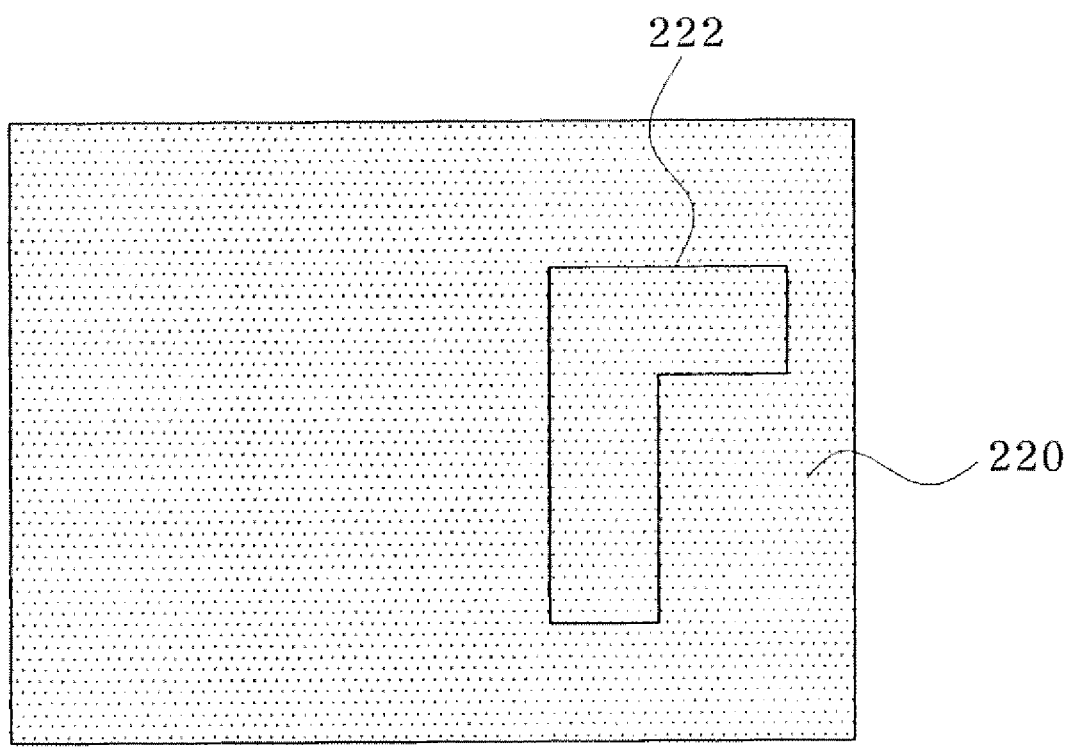

More specifically, since the first light 130 has the first wave length λ1, the first light 131 transmitted through the surface of the substrate 100 adjacent to the first phase shift pattern 121 and the first light 132 transmitted through the first phase shift pattern 121 are destructively interfered. Therefore, the first phase shift pattern 121 is not transferred onto the photoresist layer 220. On the contrary, the first light 131 transmitted through the surface of the substrate 100 adjacent to the second phase shift pattern 122 and the first light 133 transmitted through the second phase shift pattern 122 show the phase difference of 180° without the destructive interference and the second phase shift pattern 122 is thus transferred onto the resist layer 220. As the result of performing such first exposure, as shown in FIG. 2B, a second exposed region 222 corresponding to the second phase shift pattern 122 is formed over the photoresist layer 220.

Figure 3A:
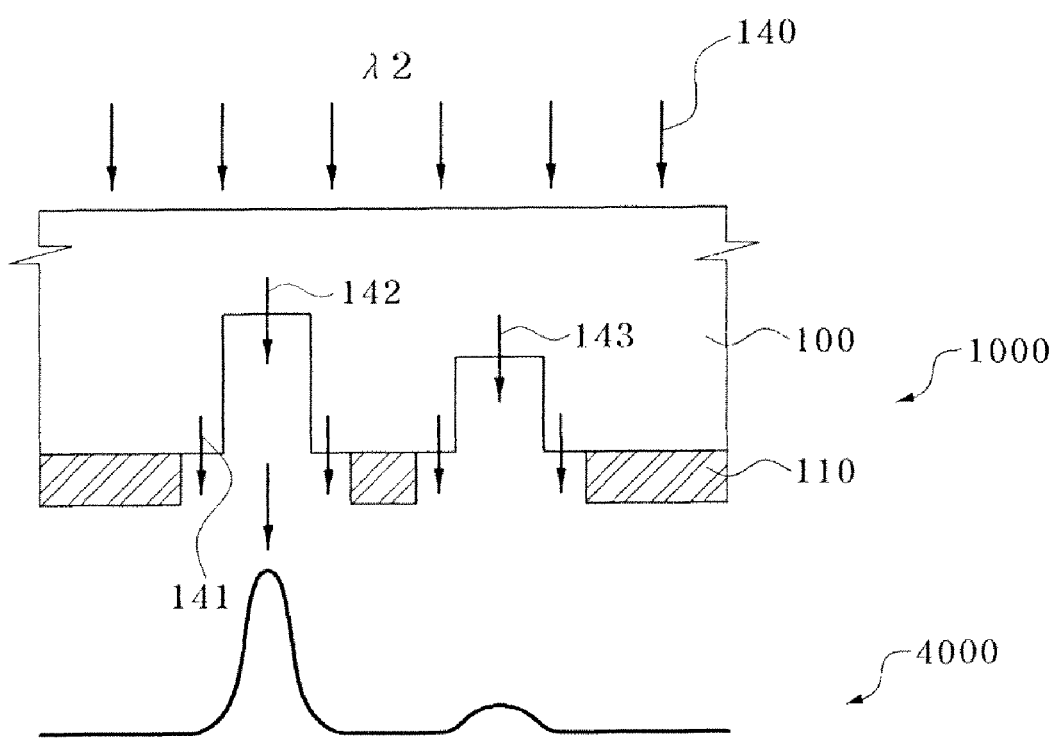
Figure 3A:
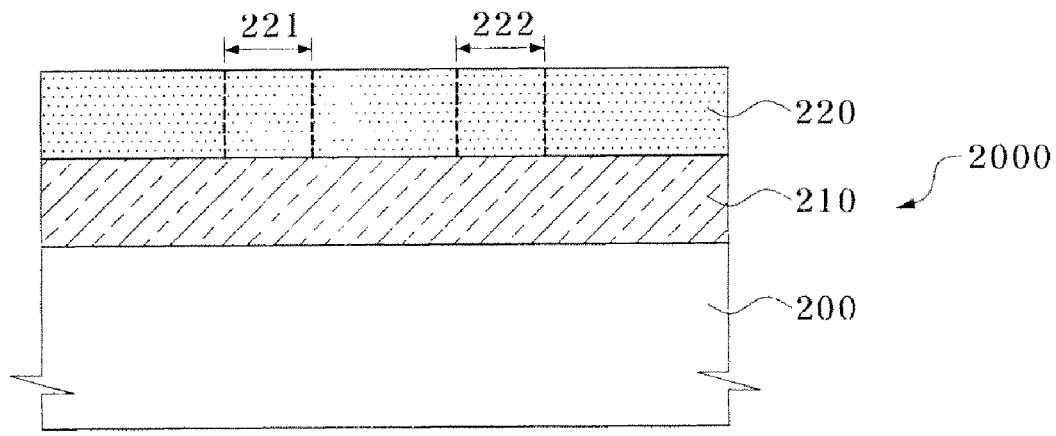

Next, referring to FIG. 3A, a second exposure uses a second light with a second wave length λ2. To this end, the second light 140 with the second wave length λ2 is incident to the phase shift mask 1000. The second light 140 with the second wave length λ2 may be divided into a second light 141 passing through where a surface of a substrate 100, a second light 142 passing through the first phase shift pattern 121 and a second light 143 passing through the second phase shift pattern 122. When the second light 140 passes through the mask 1000, as indicated by a reference symbol "4000" in the figure, an intensity of the second light 142 transmitted through the first phase shift pattern 121 is amplified, but the intensity of the second light 143 transmitted through the second phase shift pattern 122 becomes close to 0. Therefore, the first phase shift pattern 121 alone is transferred onto the photoresist layer 220.

Figure 3B:
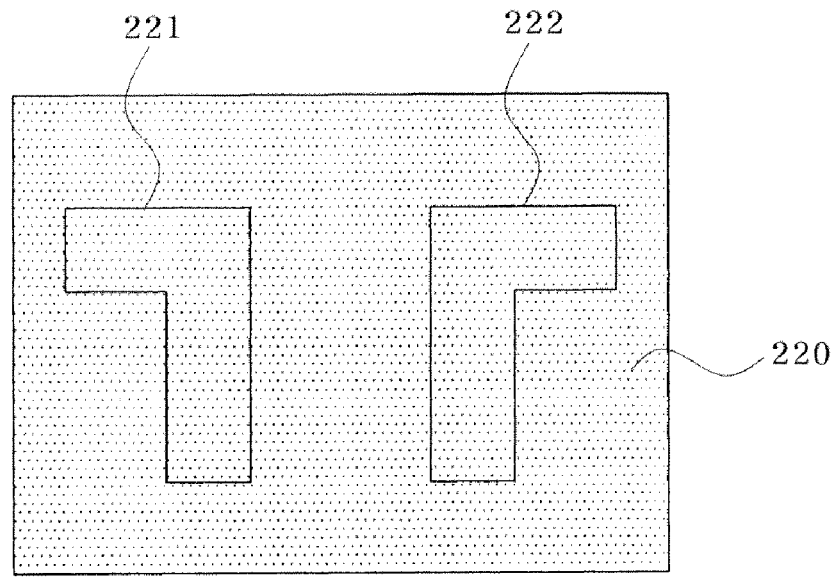

More specifically, since the second light 140 has the second wave length λ2, the second light 141 transmitted through the surface of the substrate 100 adjacent to the second phase shift pattern 122 and the second light 142 transmitted through the second phase shift pattern 122 are destructively interfered. Therefore, the second phase shift pattern 122 is not transferred onto the photoresist layer 220 by the second exposure using the second light 140 with the second wave length λ2. On the contrary, the second light 141 transmitted through the surface of the substrate 100 adjacent to the first phase shift pattern 121 and the second light 143 transmitted through the first phase shift pattern 121 show the phase difference of 180° without the destructive interference and the first phase shift pattern 121 is thus transferred onto the resist layer 220. As the result of performing such second exposure, as shown in FIG. 3B, a first exposed region 221 corresponding to the first phase shift pattern 121 is formed over the photoresist layer 220 in a region adjacent to the second exposed region 222 formed by the first exposure.

Although a distance between the first exposed region 221 and the second exposed region 222 is such a fine distance that cannot be accurately realized using standard photolithography due to its resolution limit, the first exposed region 221 and the second exposed region 222 of the fine distance can be formed by forming the exposed region 221 and the second exposed region 222 separately through the first exposure using the first light with the first wave length λ1 and the second exposure using the second light with the second wave length λ2. In addition, by performing the first exposure and the second exposure using a single mask, the problem of registration error between masks generated when using two masks can be prevented from the beginning.

Figure 4:
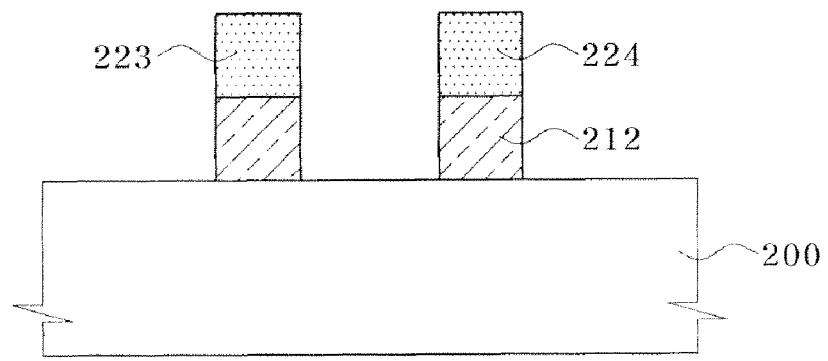
FIG. 4 illustrates a cross-sectional view of patterns formed using the wafer exposure method according to an embodiment of the present invention.

FIG. 4 illustrates a cross-sectional view of patterns formed using the wafer exposure method according to an embodiment of the present invention. Referring to FIG. 4, a development process is performed on the photoresist layer 220, in which the first exposed region 221 and the second exposed region 222 are formed by the first exposure and the second exposure, to form a first photoresist layer pattern 223 and a second photoresist layer pattern 224 respectively corresponding to the first exposed region 221 and the second exposed region 222. Subsequently, by etching the exposed portion of the pattern target layer 210 using the first photoresist layer pattern 223 and the second photoresist layer pattern 224 as an etching mask, the first pattern 211 and the second pattern 212 having fine distance are formed over the substrate 200.

While the present invention has been described with respect to the specific embodiments, it will be apparent to those skilled in the art that various changes and modifications may be made without departing from the spirit and scope of the invention as defined in the following claims.

What is claimed is:

1. A phase shift mask, comprising:
   a substrate;
   a first phase shift pattern formed in a groove shape having a first depth within the substrate so that when a first light with a first wave length is incident, the first light transmitted through a surface of the substrate and the first light transmitted through the groove are destructively interfered and when a second light with a second wave length, which differs from the first wave length, is incident, the second light transmitted through the surface of the substrate and the second light transmitted through the groove are constructively interfered; and
   a second phase shift pattern formed in a groove shape having a second depth within the substrate so that when the first light with the first wave length is incident, the first light transmitted through the surface of the substrate and the first light transmitted through the groove are constructively interfered and when the second light with the second wave length is incident, the second light transmitted through the surface of the substrate and the second light transmitted through the groove are destructively interfered.

2. The phase shift mask of claim 1, further comprising a mask pattern which exposes the surface of the substrate in the vicinity of the first phase shift pattern and the second phase shift pattern.

3. The phase shift mask of claim 2, wherein the mask pattern is formed of a chrome layer or a molybdenum silicon layer.

4. The phase shift mask of claim 1, wherein the first phase shift mask and the second phase shift mask are disposed so as to be adjacent to each other.

5. The phase shift mask of claim 1, wherein the first depth of the first phase shift pattern is such that the phase difference between the first light that transmitted through the surface of the surface and the first light transmitted through the groove is substantially 180 degrees.

6. The phase shift mask of claim 1, wherein the second depth of the second phase shift pattern is such that the phase difference between the second light that transmitted through the surface of the surface and the second light transmitted through the groove is substantially 180 degrees.

7. A method for exposing a wafer using a double patterning technology, comprising:
   disposing a phase shift mask over a wafer within an exposure apparatus, the phase shift mask having a first phase shift pattern within a substrate formed in a groove having a first depth in which a destructive interference is generated with respect to a first light with a first wave length and a second phase shift pattern within the substrate formed in a groove having a second depth in which a destructive interference is generated with respect to a second light with a second wave length which differs from the first wave length;
   transferring the second phase shift pattern onto the wafer by exposing the first light with the first wave length to be incident to the phase shift mask; and
   transferring the first phase shift pattern onto the wafer by exposing the second light with the second wave length to be incident to the phase shift mask.

8. The method in claim 7, wherein the first depth in which a constructive interference is generated with respect to the second light with the second wave length.

9. The method in claim 7, wherein the second depth in which a constructive interference is generated with respect to the first light with the first wave length.

* * * * *